(12) United States Patent
Mather et al.

(10) Patent No.: US 7,888,756 B2
(45) Date of Patent: Feb. 15, 2011

(54) MRAM TUNNEL BARRIER STRUCTURE AND METHODS

(75) Inventors: Phillip Glenn Mather, Maricopa, AZ (US); Renu W. Dave, Chandler, AZ (US); Frederick B. Mancoff, Chandler, AZ (US)

(73) Assignee: Everspin Technologies, Inc., Chandler, AZ (US)

( * ) Notice: Subject to any disclaimer, the term of this patent is extended or adjusted under 35 U.S.C. 154(b) by 959 days.

(21) Appl. No.: 11/689,722

(22) Filed: Mar. 22, 2007

(65) Prior Publication Data
US 2008/0232002 A1    Sep. 25, 2008

(51) Int. Cl.
*H01L 29/70* (2006.01)
(52) U.S. Cl. .................. 257/421; 257/422; 438/3; 365/157; 360/324.2
(58) Field of Classification Search .................. 257/20, 257/414, 421–427, E29.323; 438/3; 360/324–326; 365/157–158, 171–173; 29/737
See application file for complete search history.

(56) References Cited

U.S. PATENT DOCUMENTS

| | | | |
|---|---|---|---|
| 6,347,049 B1* | 2/2002 | Childress et al. ............ 365/173 |
| 6,756,128 B2 | 6/2004 | Carey et al. |
| 2002/0114112 A1* | 8/2002 | Nakashio et al. .......... 360/324.2 |
| 2006/0017081 A1* | 1/2006 | Sun et al. ..................... 257/295 |
| 2008/0170337 A1* | 7/2008 | Hirata et al. ............. 360/324.2 |

OTHER PUBLICATIONS

Rottlander et al., "Barrier thickness dependence of the magnetoresistance in TaOx magnetic tunnel junctions", Applied Physics Letters, 78, 3274 (2001).*
Wong, P.K., et al., High Conductance magnetoresistive tunnel junctions with multiply oxidized barrier, Journal of Applied Physics, vol. 83, No. 11, Jul. 1, 1998.

\* cited by examiner

*Primary Examiner*—Bradley K Smith
*Assistant Examiner*—Jami M Valentine
(74) *Attorney, Agent, or Firm*—Ingrassia Fisher & Lorenz, P.C.

(57) ABSTRACT

A magnetic tunnel junction (MTJ) structure is of the type having a tunnel barrier positioned between a fixed ferromagnetic layer and a free ferromagnetic layer, the tunnel barrier includes a first barrier layer contacting either the fixed ferromagnetic layer or the free ferromagnetic layer. The first barrier layer transmits a high spin polarization and is selected from the group consisting of metal oxides, metal nitrides, and metal oxynitrides. The second barrier layer, which contacts the first barrier layer, has a low barrier height and is selected from the group consisting of metal oxides, metal nitrides, and metal oxynitrides.

16 Claims, 3 Drawing Sheets

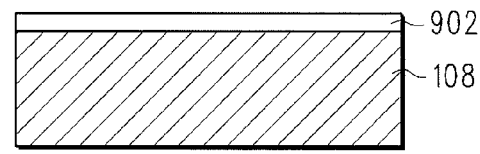
FIG. 8　　　　　　FIG. 9
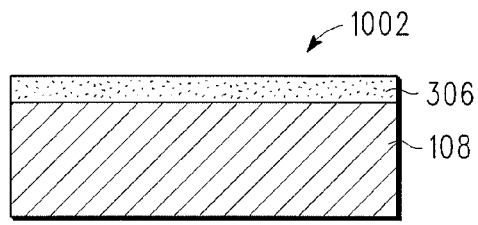
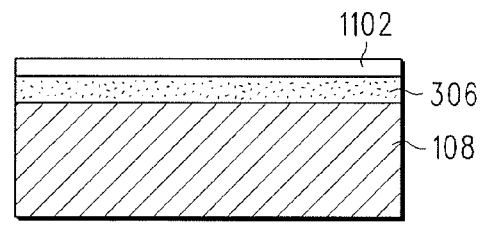
FIG. 10　　　　　　FIG. 11
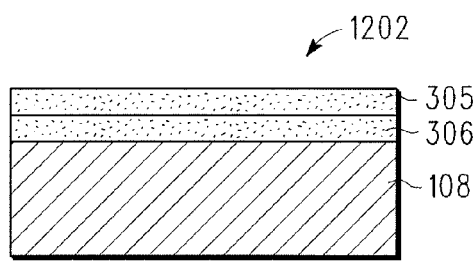
FIG. 12

MRAM TUNNEL BARRIER STRUCTURE AND METHODS

TECHNICAL FIELD

The present invention generally relates to magnetoresistive random access memories (MRAMs) and sensor elements comprising magnetic tunnel junctions (MTJs), and more particularly relates to tunnel barriers used in such MTJs.

BACKGROUND

Magnetoresistive random access memories (MRAMs) combine magnetic components to achieve non-volatility, high-speed operation, and excellent read/write endurance. In a standard MRAM device, such as that illustrated in FIG. 1 for a single bit, information is stored in the magnetization directions (illustrated by arrows) of individual magnetic tunnel junctions (MTJs) 102. MTJ 102 generally includes an insulating tunnel barrier 106 between two ferromagnetic layers: free ferromagnetic layer (or simply "free magnet") 104, and fixed ferromagnetic layer (or "fixed magnet") 108. In a standard MRAM, the bit state is programmed to a "1" or "0" using applied magnetic fields 114 and 116 generated by currents flowing along adjacent conductors—e.g., orthogonally-situated digit lines 118 and bit lines 110. The applied magnetic fields 114 and 116 selectively switch the magnetic moment direction of free magnet 104 as needed to program the bit state. When layers 104 and 108 are aligned in the same direction, and a voltage is applied across MTJ 102 (e.g., via isolation transistor 120 having a suitably controlled gate 121), a lower resistance is measured than when layers 104 and 108 are set in opposite directions.

In spin-transfer MRAM devices, such as that shown in FIG. 2, the bits are written by forcing a current directly through the stack of materials that make up the MTJ 102 (e.g., via current 202 controlled via isolation transistor 120). Generally speaking, the write current $I_{DC}$, which is spin polarized by passing through one ferromagnetic layer (104 or 108), exerts a spin torque on the subsequent layer. This torque can be used to switch the magnetization of free magnet 104 between two stable states by changing the write current polarity. Spin-transfer MRAMs are advantageous in that they provide greater density with lower power consumption.

The relatively high current density traveling through the bit means that the resistance-area product (RA-product) of the tunnel barrier layer, which dominates the device-specific resistance, should be low—i.e., less than about $30\Omega\mu m^2$. The voltage required to drive a high enough current density through the tunnel barrier to cause a magnetization reversal in a bit which is stable against thermally-induced magnetization reversal is very close to the tunnel barrier breakdown voltage. While various known tunnel barrier structures provide suitable magnetoresistance and spin torque effects, the required switching voltage of such tunnel barriers remains very close to the tunnel barrier breakdown voltage, resulting in a high percentage of devices that breakdown before switching.

It is therefore desirable to provide improved tunnel barrier structures for sensors and spin-transfer MRAM devices, particularly low resistance-area product MTJs. Furthermore, other desirable features and characteristics of the present invention will become apparent from the subsequent detailed description of the invention and the appended claims, taken in conjunction with the accompanying drawings and this background of the invention.

BRIEF DESCRIPTION OF THE DRAWINGS

The present invention will hereinafter be described in conjunction with the following drawing figures, wherein like numerals denote like elements.

FIGS. 8-12 are conceptual cross-sectional views showing successive steps of a method of fabricating two layers of an MTJ in accordance with one embodiment.

DETAILED DESCRIPTION

Figure 2:
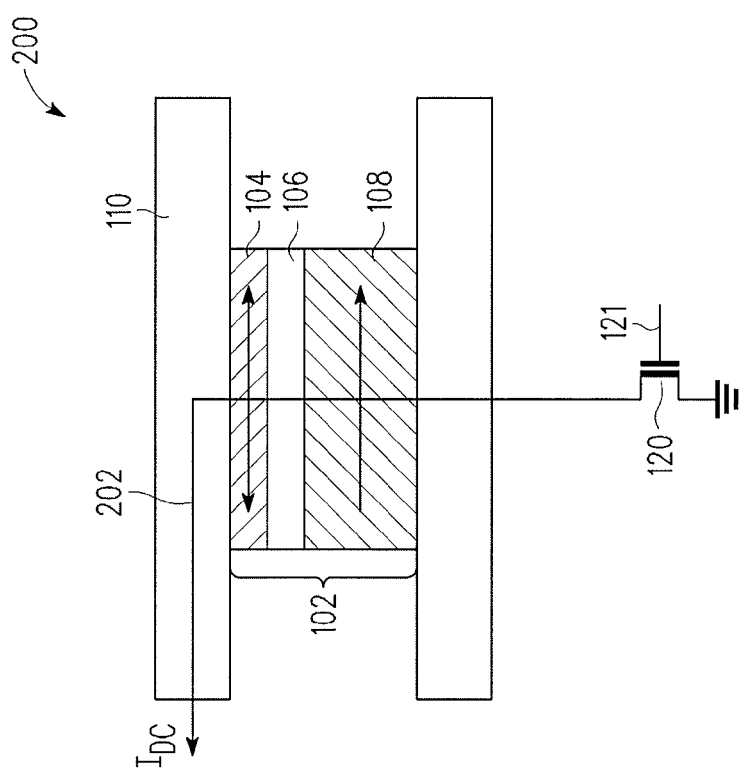
FIG. 2 is a cross-sectional view of a prior art spin-transfer MRAM MTJ.
Figure 1:
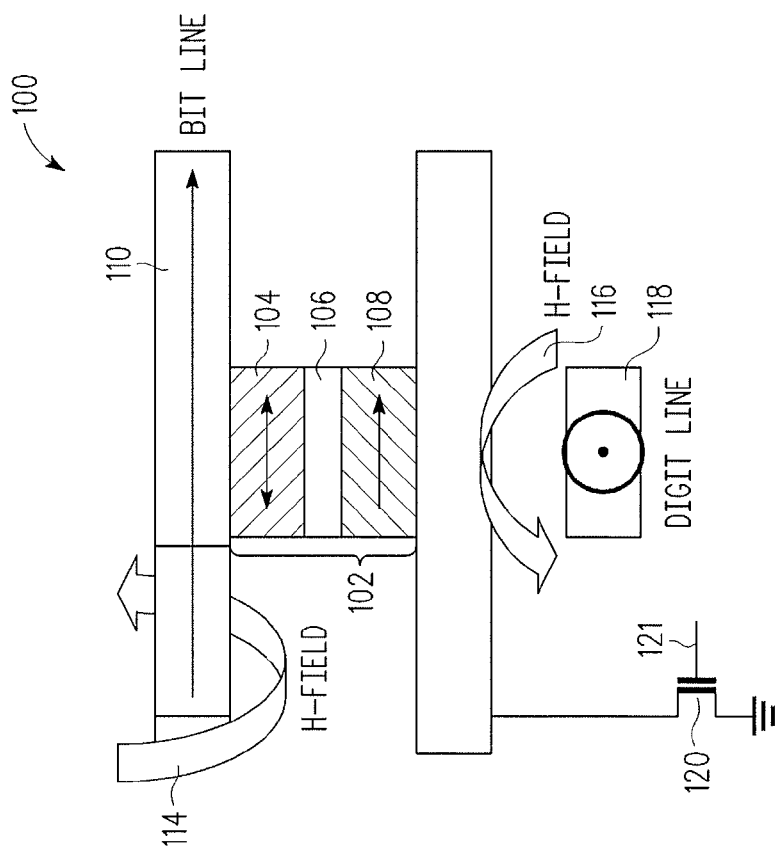
FIG. 1 is a conceptual cross-sectional view of a prior art standard MRAM MTJ.

The following detailed description is merely exemplary in nature and is not intended to limit the range of possible embodiments and applications. Furthermore, there is no intention to be bound by any theory presented in the preceding background or the following detailed description. For example, while the conceptual cross-sectional drawings illustrate discrete layers of oxides and metals, it will be understood that, for very thin layers, there may be mixing across boundaries and the like, and that sharp boundaries between layers may not in fact exist.

For simplicity and clarity of illustration, the drawing figures depict the general structure and/or manner of construction of the various embodiments. Descriptions and details of well-known features and techniques may be omitted to avoid unnecessarily obscuring other features. Elements in the drawing figures are not necessarily drawn to scale: the dimensions of some features may be exaggerated relative to other elements to improve understanding of the example embodiments.

Terms of enumeration such as "first," "second," "third," and the like may be used for distinguishing between similar elements and not necessarily for describing a particular spatial or chronological order. These terms, so used, are interchangeable under appropriate circumstances. The embodiments of the invention described herein are, for example, capable of use in sequences other than those illustrated or otherwise described herein. Unless expressly stated otherwise, "connected" means that one element/node/feature is directly joined to (or directly communicates with) another element/node/feature, and not necessarily mechanically. Likewise, unless expressly stated otherwise, "coupled" means that one element/node/feature is directly or indirectly joined to (or directly or indirectly communicates with) another element/node/feature, and not necessarily mechanically.

The terms "comprise," "include," "have" and any variations thereof are used synonymously to denote non-exclusive inclusion. The terms "left," "right," "in," "out," "front," "back," "up," "down," and other such directional terms are used to describe relative positions, not necessarily absolute positions in space. The term "exemplary" is used in the sense of "example," rather than "ideal."

In the interest of conciseness, conventional techniques, structures, and principles known by those skilled in the art may not be described herein, including, for example, standard MRAM processing techniques, fundamental principles of magnetism, and basic operational principles of memory devices.

In general, what is described herein is a multi-layer tunnel barrier structure for use in a magnetic tunnel junction (MTJ) that includes at least two barrier layers: The first barrier layer—which is a metal oxide, nitride, or oxynitride (e.g., MgO, MgxNy, or MgOxNy)—contacts either the fixed ferromagnetic layer or the free ferromagnetic layer and is selected to transmit high spin polarization (e.g., greater than about 40%). The second barrier layer contacts the first barrier layer, has a low barrier height (e.g., less than about 0.5 eV), and is also selected from the group consisting of metal oxides, metal nitrides, and metal oxynitrides. In this way, by combining one or more barrier layers transmitting a high spin polarization with one or more layers having a low barrier height, the resulting tunnel barrier allows a thicker total tunnel barrier structure to be provided for a given RA product, resulting in improved breakdown voltage and barrier strength.

Figure 3:
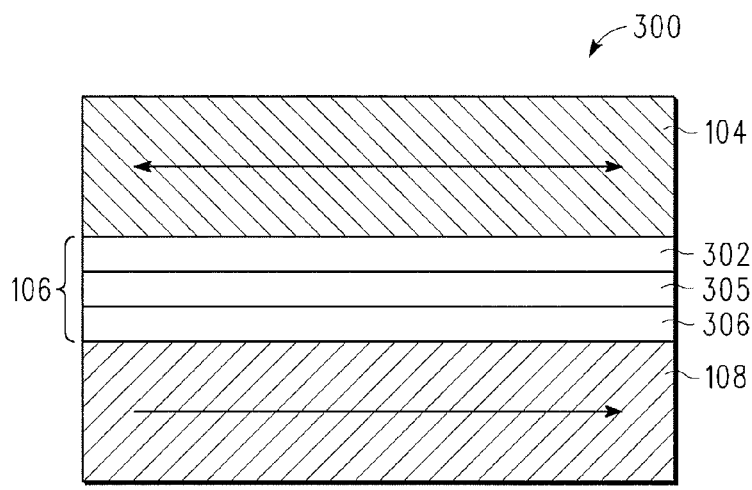
FIG. 3 is a conceptual cross-sectional view of an MTJ in accordance with one embodiment.

Referring now to FIG. 3, an exemplary MTJ structure 300 includes a tunnel barrier 106 provided between free ferromagnetic layer (or "free magnet") 104 and fixed ferromagnetic layer (or "fixed magnet") 108. Tunnel barrier 106, in this embodiment, includes three barrier layers: 302, 305, and 306. Barrier layers 302 and 306 contact free magnet 104 and fixed magnet 108, respectively, while barrier layer 305 is provided therebetween. For the purposes of clarity, some commonly-used layers have not been illustrated in the drawings, including various protective cap layers, seed layers, pinning layers, and the underlying substrate (which may be a conventional semiconductor substrate or any other suitable structure).

Ferromagnetic layers 104 and 108 may comprise any suitable material or combination of materials having the desired ferromagnetic properties. Popular materials include Ni, Co Fe, CoFeB, and combinations thereof, but other elements and combinations may be used. Half-metallic ferromagnets, such as, for example, $CrO_2$, $Fe_3O_4$, or NiMnSb may also be used in order to give a very large spin-polarization.

Each barrier layer 302, 305, and 306 comprises a metal oxide, a metal nitride, or a metal oxynitride material—that is, a metal (e.g., Mg, Ti, Gd, Hf, Al, Zr, Y, Ta and the alloys thereof) that has been suitably oxidized, nitridized, or oxynitridized via exposure to various compositions of oxygen and/or nitrogen. For the purpose of simplicity of expression, and without loss of generality, the term "metal oxide" (or specific oxides, such as MgO) may be used in conjunction with the various illustrated embodiments described below. It will be understood, however, that such discussions are not intended to limit the embodiments to metal oxides, and that nitrides and oxynitrides of the various metals may be substituted.

Either one or both of barrier layers 302 and 306 forms an interface with the ferromagnetic layers 104 and/or 108 which provides highly spin-polarized transmission. As is known in the art, the spin polarization of a structure measures the degree to which the spin (the intrinsic angular momentum of its particles) is aligned in a particular direction. This parameter is related to the magnetic moment of the layer, and is expressed in percent. The phrase "high spin polarization" as used herein generally refers to materials or structures transmitting a spin polarization greater than about 40%. Examples of such materials include interfaces between conventional ferromagnets (such as Co, Fe, CoFeB, and their alloys) and insulators such as magnesium oxide (MgO), magnesium nitride ($Mg_xN_y$), and magnesium oxynitride. Any other material or combination of materials having a high spin polarization may also be used.

In the illustrated embodiment, barrier layer 305 has a low barrier height. Depending upon the embodiment, barrier layer 302 or 306 may also have a low barrier height. As used herein, the term "low barrier height" generally refers to materials or structures having a barrier height that is less than about 0.5 eV. Conversely, the term "high barrier height" generally refers to materials or structures having a barrier height that is greater than about 1.0 eV. Suitable materials for barrier layer 305 include, for example, oxide, nitrides, and oxynitrides of Ti, Hf, Al, Zr, Y, Ta, and alloys thereof. While $AlO_x$ by itself is not a low barrier height material, various alloys containing Al may be considered as such. In a particular embodiment, barrier layer 305 comprises titanium oxide ($TiO_x$).

The thicknesses of the various layers (and the combined thickness of tunnel barrier 106) may vary depending upon the number of barrier layers, the fabrication methods used, and the desired breakdown voltage. In one embodiment, for example, each barrier layer is formed by depositing 1.0-8.0 Å of metal (e.g., Mg, Ti, etc.) and exposing that layer to a suitable oxide, nitride, or oxynitride environment. In an embodiment with three such layers, the total thickness of tunnel barrier 106 may vary from between 4 to 30 Å, depending upon the barrier heights of the constituent materials, and the desired RA of the finished MTJ.

Figure 4:
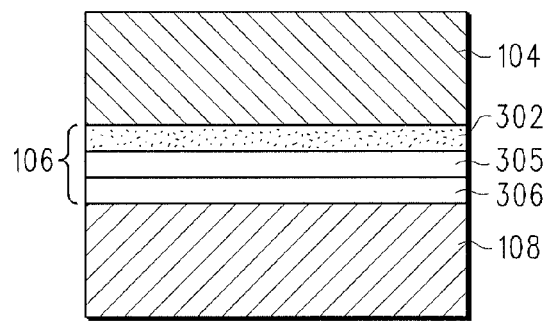
FIGS. 4-7 are conceptual cross-sectional views of an MTJ in accordance with various embodiments.
Figure 5:
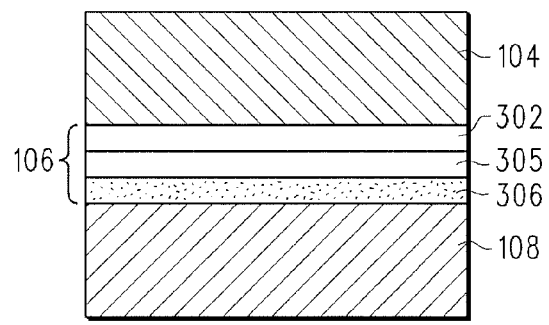
Figure 6:
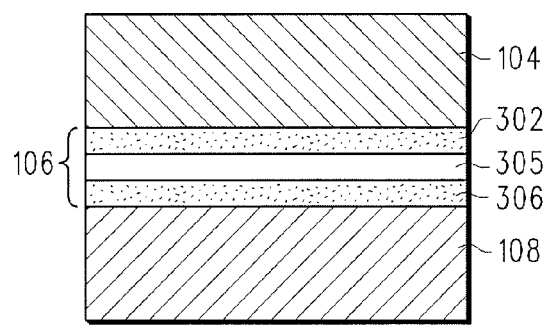

In general, it is desirable that one or more layers contacting ferromagnetic layers 104 and/or 108 forms an interface with ferromagnets 104 and 108 that provides highly spin-polarized transmission, and that the remaining layer or layers have a low barrier height. In a particular embodiment, MgO is used as the high spin polarization layer or layers, and other metal oxides (based on Ti, Hf, Al, Zr, Ta or Y) are used for any remaining non-MgO layers. Referring to FIGS. 4-7, for example (where cross-hatching has been used to indicate MgO or other materials contributing to an interface with highly spin polarized transmission), a number of potential embodiments are illustrated. In FIG. 4, barrier layer 302 contacting free magnet 104 comprises MgO, and the remaining barrier layers 305 and 306 comprise a low barrier height material. In FIG. 5, barrier layer 306 contacting fixed magnet 108 comprises MgO. In FIG. 6, both barrier layers 302 and 306 comprise MgO, and in FIG. 7, all barrier layers 302, 305, 306 comprise MgO.

Figure 7:
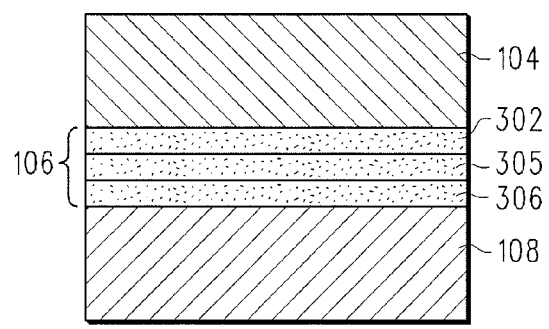

The benefits of depositing a structure of three or more layers wherein each layer comprises the same barrier material, such as illustrated for a trilayer structure in FIG. 7, stems from the fact that each additional layer may cover the pinholes and weak spots present from the previous N−1 layers. Trilayer structures have demonstrated a higher breakdown voltage than bilayer or single layer structures at the same RA, and quadlayer structures show an improvement over trilayer structures, and so on.

FIGS. 8-12 are conceptual cross-sectional diagrams depicting successive formation of two barrier layers in accordance with an exemplary method. Initially, a suitable fixed magnet 108 is provided. A metal layer 902 is then deposited on fixed magnet 108 using sputtering, ion-beam deposition, evaporation, or any other conventional metal deposition technique. As mentioned previously, suitable metals for layer 902 include, for example, Mg, Ti, Hf, Al, Zr, Ta and Y. The thickness of this layer may be, for example, 1-8 Å.

Next, as shown in FIG. 10, barrier layer 306 is formed by exposing the surface of layer 902 to an oxidizing, nitridizing, or oxynitridizing environment 1002 for a predetermined time period. Environment 1002 may have any suitable temperature, pressure, and composition. In one embodiment, layer 902 is exposed to high purity oxygen at a temperature of about 300° K for approximately 1-80 seconds.

To build successive layers, as shown in FIGS. 11 and 12, another metal layer 1102 is sputtered, ion-beam deposited, evaporated, or otherwise formed and exposed to an environment 1202. This results in formation of barrier layer 305. The oxide/nitride/oxynitride layers may be formed via sputtering—e.g., from a MgOxNy target of the desired composition. Any number of layers may be formed in this way, using the same or different process steps. For example, MTJ embodiments with four or more layers may incorporate the above processes and principles.

The various illustrated tunnel barrier and MTJ embodiments may be used in a variety of MRAM and field sensing applications, such as standard MRAMs and spin-transfer MRAMs. In general, as mentioned previously, the described methods and structures may advantageously be used in low RA-product MTJs—i.e., MRAM or sensor devices with RA-product values that are less than about 30 $\Omega\mu m^2$ In summary, what has been described is a magnetic tunnel junction (MTJ) structure of the type having a tunnel barrier positioned between a fixed ferromagnetic layer and a free ferromagnetic layer, the tunnel barrier comprising: a first barrier layer contacting either the fixed ferromagnetic layer or the free ferromagnetic layer, wherein the first barrier layer transmits a high spin polarization and is selected from the group consisting of metal oxides, metal nitrides, and metal oxynitrides; and a second barrier layer contacting the first barrier layer, wherein the second barrier layer has a low barrier height and is selected from the group consisting of metal oxides, metal nitrides, and metal oxynitrides. In one embodiment, the first barrier layer transmits a spin polarization greater than about 40%, and may comprise MgO. The second barrier layer has a barrier height less than about 0.5 eV, and may comprise a metal selected from the group consisting of Ti, Hf, Ta, Zr, Ta, and Y.

In one embodiment, the first barrier layer is formed on the fixed ferromagnetic layer and the second barrier layer is formed on the first barrier layer, and the MTJ further includes: a third barrier layer formed on the second barrier layer and contacting the free ferromagnetic layer, the third barrier layer selected from the group consisting of metal oxides, metal nitrides, and metal oxynitrides. In one embodiment, the third barrier layer transmits a high spin polarization, and may comprise MgO. In another embodiment, the third barrier layer is based on a metal selected from the group consisting of Ti, Hf, Al, Zr, Ta, and Y. The second barrier layer may comprise $TiO_x$.

In one embodiment, the fixed ferromagnetic layer, the free ferromagnetic layer, and the tunnel barrier together operate as an MRAM device having a resistance-area product that is less than about 30 $\Omega\mu m^2$. In another embodiment, the fixed ferromagnetic layer, the free ferromagnetic layer, and the tunnel barrier together operate as a spin-transfer MRAM device.

A method for fabricating a magnetic tunnel junction (MTJ) tunnel barrier between a fixed ferromagnetic layer and a free ferromagnetic layer generally includes: forming a first barrier layer such that it transmits a high spin polarization and is formed from a material selected from the group consisting of metal oxides, metal nitrides, and metal oxynitrides; forming a second barrier layer such that it has a low barrier height, contacts the first barrier layer, and is formed from a material selected from the group consisting of metal oxides, metal nitrides, and metal oxynitrides; and forming the fixed ferromagnetic layer and the free ferromagnetic layer such that at least one of the ferromagnetic layers contacts the first barrier layer. In one embodiment, forming the first barrier layer includes forming a metallic layer and exposing the metallic layer to an oxygen environment. In another, forming the metallic layer includes forming a layer of Mg. A further embodiment includes: forming the first barrier layer on the fixed ferromagnetic layer; forming the second barrier layer on the first barrier layer; forming a third barrier layer on the second barrier layer, the third barrier layer selected from the group consisting of metal oxides, metal nitrides, and metal oxynitrides; and forming the free ferromagnetic layer on the third barrier layer. Forming the third barrier layer may include forming a MgO layer.

A multi-layer MTJ structure in accordance with one embodiment includes: a fixed ferromagnetic layer; a multilayer barrier structure formed on the fixed ferromagnetic layer; and a free ferromagnetic layer formed on the multilayer barrier structure; wherein the multilayer barrier structure comprises a first, a second, a third, and a fourth barrier layer, and wherein the first and fourth barrier layers each transmit a high spin polarization and are selected from the group consisting of metal oxides, metal nitrides and metal oxynitrides. In one embodiment, the first and fourth barrier layers transmit a spin polarization greater than approximately 40%, and wherein the second barrier layer has a barrier height less than approximately 0.5 eV. In another embodiment, the first and fourth barrier layers comprise MgO and the second barrier layer is based on a metal selected from the group consisting of Ti, Hf, Al, Ta, Zr, Ta, and Y.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the embodiments in any way. Rather, the foregoing detailed description will provide those skilled in the art with a convenient road map for implementing an exemplary embodiment, it being understood that various changes may be made in the function and arrangement of elements described in an exemplary embodiment without departing from the scope as set forth in the appended claims.

The invention claimed is:

1. A magnetic tunnel junction (MTJ) structure of the type having a tunnel barrier positioned between a fixed ferromagnetic layer and a free ferromagnetic layer, the tunnel barrier comprising:
   a first barrier layer contacting either the fixed ferromagnetic layer or the free ferromagnetic layer, wherein the first barrier layer transmits a high spin polarization and is selected from the group consisting of metal oxides, metal nitrides, and metal oxynitrides; and
   a second barrier layer contacting the first barrier layer, wherein the second barrier layer has a barrier height of less than about 0.5 eV and comprises $TiO_x$
   a third barrier layer formed on the second barrier layer and contacting the free ferromagnetic layer, the third barrier layer selected from the group consisting of metal oxides, metal nitrides, and metal oxynitrides,
   wherein the first barrier layer is formed on the fixed ferromagnetic layer and the second barrier layer is formed on the first barrier layer.

2. The MTJ structure of claim 1, wherein the first barrier layer transmits a spin polarization greater than about 40%.

3. The MTJ structure of claim 2, wherein the first barrier layer comprises MgO.

4. The MTJ structure of claim 1, wherein the third barrier layer transmits a high spin polarization.

5. The MTJ structure of claim 4, wherein the third barrier layer comprises MgO.

6. The MTJ structure of claim 1, wherein the fixed ferromagnetic layer, the free ferromagnetic layer, and the tunnel barrier together operate as an MRAM device having a resistance-area product that is less than about $30\Omega\mu m^2$.

7. The MTJ structure of claim 1, wherein the fixed ferromagnetic layer, the free ferromagnetic layer, and the tunnel barrier together operate as a spin-transfer MRAM device.

8. A method for fabricating a magnetic tunnel junction (MTJ) tunnel barrier between a fixed ferromagnetic layer and a free ferromagnetic layer, comprising:
   forming a first barrier layer such that it transmits a high spin polarization and is formed from a material selected from the group consisting of metal oxides, metal nitrides, and metal oxynitrides;
   forming a second barrier layer such that it has a barrier height of less than about 0.5 eV, contacts the first barrier layer, and comprises $TiO_x$; and
   forming the fixed ferromagnetic layer and the free ferromagnetic layer such that at least one of the ferromagnetic layers contacts the first barrier layer.

9. The method of claim 8, wherein forming the first barrier layer includes forming a metallic layer and exposing the metallic layer to an oxygen environment.

10. The method of claim 9, wherein forming the first barrier layer includes forming a layer of Mg.

11. The method of claim 8, including:
   forming the first barrier layer on the fixed ferromagnetic layer;
   forming the second barrier layer on the first barrier layer;
   forming a third barrier layer on the second barrier layer, the third barrier layer selected from the group consisting of metal oxides, metal nitrides, and metal oxynitrides; and
   forming the free ferromagnetic layer on the third barrier layer.

12. The method of claim 11, wherein forming the third barrier layer includes forming a MgO layer.

13. A multi-layer MTJ structure comprising:
   a fixed ferromagnetic layer;
   a multilayer barrier structure located on the fixed ferromagnetic layer;
   a free ferromagnetic layer located on the multilayer barrier structure;
   wherein the multilayer barrier structure comprises a first, a second, a third, and a fourth barrier layer, and wherein the first and fourth barrier layers each transmit a high spin polarization and are selected from the group consisting of metal oxides, metal nitrides and metal oxynitrides, and the second barrier layer has a barrier height of less than about 0.5eV and comprises $TiO_x$.

14. The MTJ structure of claim 13, wherein the first and fourth barrier layers transmit a spin polarization greater than approximately 40%.

15. The MTJ structure of claim 13, wherein the first and fourth barrier layers comprise MgO.

16. A method for fabricating a magnetic tunnel junction (MTJ) tunnel barrier between a fixed ferromagnetic layer and a free ferromagnetic layer, comprising:
   forming a first barrier layer comprising MgO on the fixed ferromagnetic layer such that it transmits a high spin polarization;
   forming a second barrier layer comprising $TiO_x$ on the first barrier layer;
   forming a third barrier layer comprising MgO on the second barrier layer; and
   forming the free ferromagnetic layer on the third barrier layer.

* * * * *